US010742178B2

(12) United States Patent
Zhu et al.

(10) Patent No.: US 10,742,178 B2
(45) Date of Patent: Aug. 11, 2020

(54) BROADBAND POWER TRANSISTOR DEVICES AND AMPLIFIERS AND METHODS OF MANUFACTURE THEREOF

(71) Applicant: NXP USA, Inc., Austin, TX (US)

(72) Inventors: Ning Zhu, Chandler, AZ (US); Damon G. Holmes, Scottsdale, AZ (US); Jeffrey Spencer Roberts, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/983,974

(22) Filed: May 18, 2018

(65) Prior Publication Data

US 2019/0356284 A1    Nov. 21, 2019

(51) Int. Cl.
*H03F 3/68*     (2006.01)
*H03F 3/193*    (2006.01)
(Continued)

(52) U.S. Cl.
CPC ............. *H03F 3/193* (2013.01); *H03F 1/565* (2013.01); *H03F 3/21* (2013.01);
(Continued)

(58) Field of Classification Search
CPC . H03F 3/193; H03F 1/565; H03F 3/21; H03F 2200/181; H03F 2200/387; H01L 2223/6655
(Continued)

(56) References Cited

U.S. PATENT DOCUMENTS 6,236,274 B1    5/2001    Liu
6,734,728 B1    5/2004    Leighton et al.
(Continued)

FOREIGN PATENT DOCUMENTS

| EP | 0600548 A1 | 6/1994 |
|---|---|---|
| EP | 3160042 A1 | 4/2017 |
| WO | 2009060264 A1 | 5/2009 |

OTHER PUBLICATIONS

Non Final Office Action; U.S. Appl. No. 15/984,137; 14 pages. (dated Apr. 16, 2019).
(Continued)

*Primary Examiner* — Khanh V Nguyen
*Assistant Examiner* — Khiem D Nguyen
(74) *Attorney, Agent, or Firm* — Sherry W. Schumm

(57) ABSTRACT

Embodiments of RF amplifiers and packaged RF amplifier devices each include a transistor with a drain-source capacitance that is relatively low, an output impedance matching circuit, and a harmonic termination circuit. The impedance matching circuit includes a harmonic termination circuit, which includes a first inductance (a first plurality of bondwires) and a first capacitance coupled in series between the transistor output and a ground reference node. An equivalent capacitance from a combination of the first inductive element and the first capacitance in series effectively increases the drain-source capacitance by at least 10 percent. The impedance matching circuit also includes a second inductance (a second plurality of bondwires) and a second capacitance coupled in series between the transistor output and the ground reference node, where the second inductance and the second capacitance are directly connected. The first and second capacitances may be metal-insulator-metal capacitors in an integrated passive device.

21 Claims, 8 Drawing Sheets

(51) Int. Cl.
*H03F 1/56* (2006.01)
*H03F 3/21* (2006.01)

(52) U.S. Cl.
CPC ............... *H01L 2223/6655* (2013.01); *H03F 2200/181* (2013.01); *H03F 2200/387* (2013.01)

(58) Field of Classification Search
USPC ............................. 330/302.124 R, 295, 307
See application file for complete search history.

(56) References Cited

U.S. PATENT DOCUMENTS

| | | | |
|---|---|---|---|
| 7,276,420 | B2 | 10/2007 | Liu et al. |
| 7,564,303 | B2 | 7/2009 | Perugupalli et al. |
| 7,728,671 | B2 | 6/2010 | Blair et al. |
| 8,659,359 | B2 | 2/2014 | Ladhani et al. |
| 8,736,379 | B1 | 5/2014 | Wilson et al. |
| 8,823,455 | B2 | 9/2014 | Kobayashi |
| 8,970,308 | B2 | 3/2015 | Wilson et al. |
| 9,281,283 | B2 | 3/2016 | Viswanathan et al. |
| 9,438,184 | B2 | 9/2016 | Jones et al. |
| 9,503,025 | B2 | 11/2016 | Cao et al. |
| 9,571,044 | B1 | 2/2017 | Zhu et al. |
| 9,673,766 | B1 | 6/2017 | Roberts et al. |
| 9,692,363 | B2 | 6/2017 | Zhu et al. |
| 9,762,185 | B2 | 9/2017 | Ladhani et al. |
| 9,979,361 | B1 | 5/2018 | Mangaonkar et al. |
| 2003/0076173 | A1 | 4/2003 | Moller et al. |
| 2005/0083723 | A1 | 4/2005 | Blednov et al. |
| 2008/0315392 | A1 | 12/2008 | Farrell et al. |
| 2013/0033325 | A1 | 2/2013 | Ladhani et al. |
| 2016/0344353 | A1 | 11/2016 | Watts et al. |
| 2017/0117856 | A1 | 4/2017 | Zhu et al. |
| 2018/0061785 | A1 | 3/2018 | Peyrot et al. |

OTHER PUBLICATIONS

U.S. Appl. No. 15/827,679, filed Dec. 5, 2017 (pp. 1-32).
U.S. Appl. No. 15/832,381, filed Dec. 5, 2017 (pp. 1-49).
Mohadeskasaei, et al., "A 30 Watt High Efficient High Power RF Pulse Power Amplifier," 2016 IEEE MTT-S International Conference on Numerical Electromagnetic and Multiphysics Modeling and Optimization (NEMO), Beijing, Jul. 2016 (pp. 1-3).
D. Wu, et al., "Design of a broadband and highly efficient 45W GaN power amplifier via simplified real frequency technique," 2010 IEEE MTT-S International Microwave Symposium, Anaheim, CA, May, 2010 (pp. 1090-1093).
H. Taghavi, et al., "Broadband high efficiency GaN RF power amplifier for multi-band applications," Proceedings of 2014 Mediterranean Microwave Symposium (MMS2014), Marrakech, Dec. 2014 (pp. 1-4).
K. Krishnamurthy, "Ultra-Broadband, Efficient, Microwave Power Amplifiers in Gallium Nitride HEMT Technology," PhD Dissertation, University of California, Santa Barbara, May, 2000 (pp. 1-195).
U.S. Appl. No. 15/984,137; 64 pages (May 18, 2018).
Notice of Allowance; U.S. Appl. No. 15/984,137; 5 pages (dated Oct. 17, 2019).

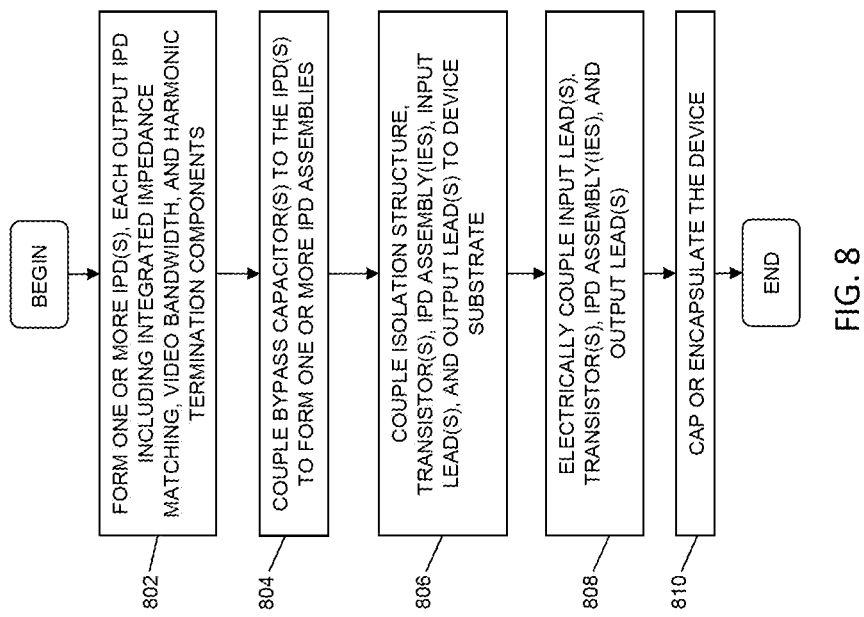

BROADBAND POWER TRANSISTOR DEVICES AND AMPLIFIERS AND METHODS OF MANUFACTURE THEREOF

TECHNICAL FIELD

Embodiments of the subject matter described herein relate generally to radio frequency (RF) amplifiers, and more particularly to broadband power transistor devices and amplifiers, and methods of manufacturing such devices and amplifiers.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

In the field of power amplifier device design, it is becoming increasingly desirable to achieve concurrent multi-band, broadband amplification. To successfully design a wideband power amplifier device for concurrent multi-band, broadband operation in a Doherty power amplifier circuit, for example, it is desirable to enable a good broadband fundamental match (e.g., over 20 percent fractional bandwidth) to appropriately handle harmonic frequency interactions, and to enable a wide video bandwidth. However, achieving these goals continues to provide challenges to power amplifier device designers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 8 is a flowchart of a method for fabricating a packaged RF power amplifier device that includes an embodiment of an output impedance matching circuit, in accordance with an example embodiment.

DETAILED DESCRIPTION

Figure 1:
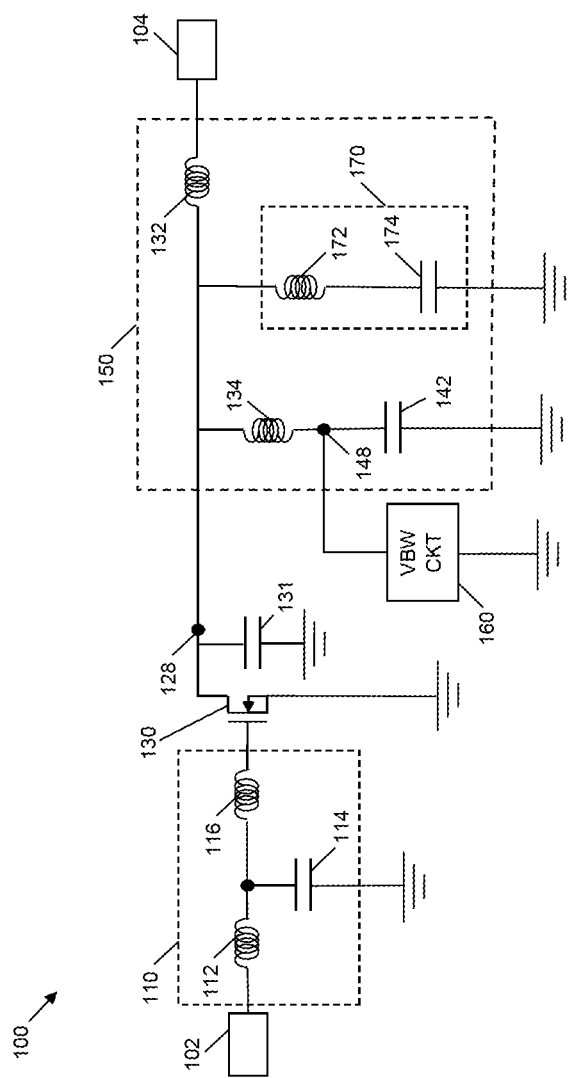
FIG. 1 is a schematic circuit diagram of a power amplifier circuit, in accordance with an example embodiment.

In the field of high-power radio frequency (RF) power amplification for cellular base stations and other applications, broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth).

For example, when compared with a silicon-based LDMOS transistor, the drain-source capacitance, Cds, of a GaN-based transistor is relatively low on a per RF output peak power basis. For example, whereas an LDMOS transistor may have a drain-source capacitance greater than about 0.4 picofarads per watt (pF/W), a GaN-based transistor may have a drain-source capacitance less than about 0.2 pF/W. If a GaN-based transistor were used in a conventional device, a relatively high inductance between the transistor output and a shunt capacitor within an output impedance matching circuit (referred to herein as "D2" inductance) would be needed to provide adequate output impedance matching. In a conventional device, this relatively high D2 inductance could be achieved, for example, using a series combination of a set of bondwires between the transistor die that includes the transistor and an additional series inductance, such as an integrated spiral inductor (e.g., a printed coil). For example, such an integrated spiral inductor could be implemented using a copper-based, integrated spiral inductor in the transistor die or in an output circuit. Unfortunately, such an integrated inductor may have a relatively low Q, which may lead to a significant efficiency drop (e.g., a drop on the order of about 3 percent at 2 gigahertz (GHz)) for the device.

Second harmonic terminations also play an important role in the overall performance of a power amplifier design that uses GaN-based transistors. Without the information of second harmonics impedance at the current source plane, it is very difficult to tune a power amplifier to achieve relatively high fractional bandwidth with good performance. Furthermore, the second harmonic termination may vary significantly across a large bandwidth for broadband applications, which further increases the difficulty of circuit tuning.

To overcome these and other challenges in designing broadband power amplifiers using GaN-based devices, the D2 inductance provided between the transistor output and the shunt capacitor within the output impedance matching circuit is significantly reduced, in various embodiments, with the inclusion of a harmonic termination circuit at the output of the device. Along with facilitating a reduction in the D2 inductance, the harmonic termination circuitry embodiments may be used to control the second harmonic impedance across a wide (e.g., 20 percent plus) fractional bandwidth at relatively low impedance (e.g., close to short circuit). This may be useful in achieving relatively high efficiency for broadband applications. Some specific embodiments of the inventive subject matter include output harmonic termination circuitry that includes an integrated capacitance (e.g., metal-insulator-metal (MIM) capacitor) and an inductance (e.g., in the form of a bondwire array) series-coupled between the transistor output and a ground reference.

During operation of an embodiment of a device, the harmonic termination circuit is essentially equivalent to a capacitor at a fundamental frequency of operation of the device, with the capacitance value being approximately equivalent to the effective capacitance of a series-coupled inductance and capacitance (e.g., inductor 172 and capacitor 174, FIG. 1) of the harmonic termination circuit. Because this equivalent shunt capacitance from the combination of the series-coupled inductance and capacitance is coupled in parallel with the drain-source capacitance between the transistor output and the ground reference, the equivalent shunt capacitance in the harmonic termination circuit effectively increases the drain-source capacitance of the transistor. In some embodiments, the equivalent shunt capacitance from the series-coupled combination of the inductance and capacitance in the harmonic termination circuit has a capacitance value that effectively increases the drain-source capacitance of the transistor to which it is connected by at least 10 percent (e.g., between 10 percent and about 50 percent or more).

As a result of this effective increase in the drain-source capacitance, the D2 inductance between the transistor output and the shunt capacitor within the output impedance matching circuit may be decreased, when compared with conventional circuits. Accordingly, whereas a conventional circuit may require an additional inductor to provide a D2 inductance that is greater than the inductance provided by the bondwires connected between the transistor die and the shunt capacitor within the output impedance matching circuit, as discussed above, no such additional inductance is included in output impedance matching circuits within device embodiments discussed herein. Instead, in device embodiments discussed herein, bondwires of the output impedance matching circuit may be directly connected (as defined later) to the shunt capacitance of the output impedance matching circuit.

In addition, the harmonic termination circuitry embodiments may be used to control the second harmonic impedance across a wide (e.g., 20 percent plus) fractional bandwidth at relatively low impedance (e.g., close to short circuit). This may be useful in achieving relatively high efficiency for broadband applications.

FIG. 1 is a schematic diagram of an RF power amplifier circuit 100. Circuit 100 includes an input 102 (e.g., a first conductive package lead), an input impedance matching circuit 110, a transistor 130, an output impedance matching circuit 150 (which includes a harmonic termination circuit 170), a video bandwidth circuit 160, and an output lead 104 (e.g., a second conductive package lead), in an embodiment. Each of the input and output 102, 104 may be more generally referred to as an "RF input/output (I/O)."

The input impedance matching circuit 110 may be referred to as an "input circuit." Similarly, the output impedance matching circuit 150 (including harmonic termination circuit 170) and the video bandwidth circuit 160 may be referred to collectively as an "output circuit." Although transistor 130 and various elements of the input and output impedance matching circuits 110, 150, the video bandwidth circuit 160, and the harmonic termination circuit 170 are shown as singular components, the depiction is for the purpose of ease of explanation only. Those of skill in the art would understand, based on the description herein, that transistor 130 and/or certain elements of the input impedance matching circuit 110, the output impedance matching circuit 150 (including the harmonic termination circuit 170), and the video bandwidth circuit 160 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 130 and various elements of the input impedance matching circuit 110, the output impedance matching circuit 150 (including the harmonic termination circuit 170), and the video bandwidth circuit 160, below, thus are not intended to limit the scope of the inventive subject matter only to the illustrated embodiments.

Input 102 and output 104 each may include a conductor, which is configured to enable the circuit 100 to be electrically coupled with external circuitry (not shown). More specifically, the input and output 102, 104 are physically positioned to span between the exterior and the interior of the device's package. Input impedance matching circuit 110 is electrically coupled between the input 102 and a first terminal of transistor 130 (e.g., the gate), which is also located within the device's interior. Similarly, output impedance matching circuit 150 (including harmonic termination circuit 170) and video bandwidth circuit 160 are electrically coupled between a second terminal of transistor 130 (e.g., the drain) and the output 104.

According to an embodiment, transistor 130 is the primary active component of circuit 100. Transistor 130 includes a control terminal and two current conducting terminals, where the current conducting terminals are spatially and electrically separated by a variable-conductivity channel. For example, transistor 130 may be a field effect transistor (FET), which includes a gate (control terminal), a drain (a first current conducting terminal), and a source (a second current conducting terminal). According to an embodiment, and using nomenclature typically applied to FETs in a non-limiting manner, the gate of transistor 130 is coupled to the input impedance matching circuit 110, the drain of transistor 130 is coupled to the output impedance matching circuit 150 (including the harmonic termination circuit 170), and the video bandwidth circuit 160, and the source of transistor 130 is coupled to ground (or another voltage reference). Through the variation of control signals provided to the gate of transistor 130, the current between the current conducting terminals of transistor 130 may be modulated.

According to various embodiments, transistor 130 is a III-V field effect transistor (e.g., a high electron mobility transistor (HEMT)), which has a relatively low drain-source capacitance, Cds, when compared with a silicon-based FET (e.g., an LDMOS FET). In FIG. 1, the drain-source capacitance of transistor 130 is represented with capacitor 131 between the drain of transistor 130 and a transistor output terminal 128 (e.g., corresponding to transistor output terminal 528, FIG. 5). More specifically, capacitor 131 is not a physical component, but instead models the drain-source capacitance of transistor 130. According to an embodiment, transistor 130 may have a drain-source capacitance that is less than about 0.2 pF/W. Further, in some embodiments, transistor 130 may be a GaN FET, although in other embodiments, transistor 130 may be another type of III-V transistor (e.g., gallium arsenide (GaAs), gallium phosphide (GaP), indium phosphide (InP), or indium antimonide (InSb)), or another type of transistor that has a relatively low drain-source capacitance.

Input impedance matching circuit 110 is coupled between the input 102 and the control terminal (e.g., gate) of the transistor 130. Input impedance matching circuit 110 is configured to raise the impedance of circuit 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 includes two inductive elements 112, 116 (e.g., two sets of bondwires) and a shunt capacitance 114. A first inductive element 112 (e.g., a first set of bondwires) is coupled between input 102 and a first terminal of capacitor 114, and a second inductive element 116 (e.g., a second set of bondwires) is coupled between the first terminal of capacitor 114 and the control terminal of transistor 130. The second terminal of capacitor 114 is coupled to ground (or another voltage reference). The combination of inductive elements 112, 116 and shunt capacitance 114 functions as a low-pass filter. According to an embodiment, the series combination of inductive elements 112, 116 may have an inductance value in a range between about 50 picohenries (pH) to about 3 nanohenries (nH), and shunt capacitance 114 may have a capacitance value in a range between about 5 picofarads (pF) to about 120 pF.

As will be described in more detail later in conjunction with FIG. 4, various embodiments of RF amplifier devices may include at least one input-side integrated passive device (IPD) assembly (e.g., IPD assembly 418, 419, FIG. 4), which includes portions of the input circuit 110. More specifically, each IPD assembly may include a semiconductor substrate with one or more integrated passive components. In a particular embodiment, each input-side IPD assembly may include shunt capacitance 114. In other embodiments, some or all of these portions of the input impedance matching circuit 110 may be implemented as distinct/discrete components or as portions of other types of assemblies (e.g., an integrated passive device (IPD), a low-temperature co-fired ceramic (LTCC) device, a small PCB assembly, and so on). In still other embodiments, some or all of these portions of the input impedance matching circuit 110 may be coupled to and/or integrated within the semiconductor die that includes transistor 130. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

On the output side of the circuit 100, harmonic termination circuit 170 is coupled between the first current conducting terminal 128 (e.g., drain) of transistor 130 and ground (or another voltage reference). Harmonic termination circuit 170 includes inductive element 172 and capacitance 174 coupled in series between the first current conducting terminal 128 of transistor 130 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 172 may have an inductance value in a range between about 20 pH to about 1 nH, and capacitance 174 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 172 may have an inductance value of about 140 pH, and capacitance 174 may have a capacitance value of about 11 pF. As will be explained later, the desired inductance and/or capacitance values used to achieve a low impedance path to ground for signal energy at the second harmonic frequency may be affected by mutual coupling between bondwires used to implement inductors 132, 134, and 172.

Output impedance matching circuit 150 is coupled between the first current conducting terminal (e.g., drain) of transistor 130 and the output 104. Output impedance matching circuit 150 is configured to match the output impedance of circuit 100 with the input impedance of an external circuit or component (not shown) that may be coupled to output 104. According to an embodiment, output impedance matching circuit 150 includes two inductive elements 132, 134 and shunt capacitance 142. A first inductive element 132 (e.g., a third set of bondwires) is coupled between the first current conducting terminal 128 (e.g., drain) of transistor 130 and the output 104. A second inductive element 134 (e.g., a fourth set of bondwires corresponding to the D2 inductance) is coupled between the first current conducting terminal of transistor 130 and a node 148, which corresponds to an RF low-impedance point node, in an embodiment. A second terminal of the shunt capacitance 142 is coupled to ground (or to another voltage reference), in an embodiment.

The shunt inductive element 134 and the shunt capacitance 142 are coupled in series between a current conducting terminal of transistor 130 and ground, and this combination of impedance matching elements functions as a first (high-pass) matching stage. Accordingly, the combination of shunt inductive element 134 and shunt capacitance 142 may be referred to herein as a high-pass matching circuit 143. According to an embodiment, shunt inductive element 134 may have an inductance value in a range between about 100 pH to about 3 nH, and shunt capacitance 142 may have a capacitance value in a range between about 30 pF to about 500 pF, although these components may have values outside of these ranges, as well.

Although not shown in FIG. 1, the output impedance matching circuit 150 also may include a second shunt circuit, which includes an additional shunt inductor (e.g., additional bondwires having an inductance value in a range between about 50 pH to about 1 nH) and an additional shunt capacitor (e.g., having a capacitance value in a range between about 1 pF to about 50 pF) coupled in series between the drain of transistor 130 and ground. This additional combination of impedance matching elements may function as a second (low-pass) matching stage.

Referring again to the first (high-pass) matching stage, an RF low-impedance point 148 is present at the node between the shunt inductive element 134 and the shunt capacitance 142. As discussed previously, the RF low-impedance point 148 represents a low impedance point in the circuit for RF signals. According to an embodiment, a video bandwidth (VBW) circuit 160 is coupled between the RF low-impedance point 148 and the ground reference node. Video bandwidth circuit 160 may function to improve the low frequency resonance (LFR) of circuit 100 caused by the interaction between the input or output impedance matching circuits 110, 150 and the bias feeds (not shown) by presenting a low impedance at envelope frequencies and/or a high impedance at RF frequencies. Video bandwidth circuit 160 essentially may be considered to be "invisible" from an RF matching standpoint, as it primarily effects the impedance at envelope frequencies (i.e., video bandwidth circuit 160 provides terminations for the envelope frequencies of circuit 100). The video bandwidth circuit 160 may have any of a number of different circuit configurations, in various embodiments.

For example, FIGS. 2A-2F illustrate six example embodiments of video bandwidth circuits (e.g., video bandwidth circuit 160, FIG. 1). In each of FIGS. 2A-2F, video bandwidth circuit 200, 201, 202, 203, 204, 205 is coupled between a connection node 248 (e.g., RF low-impedance point 148, FIG. 1) and ground (or another voltage reference). Further, each video bandwidth circuit 200-205 includes an envelope inductance 262, $L_{env}$, an envelope resistor 264, $R_{env}$, and an envelope capacitor 266, $C_{env}$, coupled in series between the connection node 248 and ground. In each of FIGS. 2A-2E, a first terminal of envelope inductance 262 is coupled to node 248, and a second terminal of envelope inductance 262 is coupled to node 280. A first terminal of envelope resistor 264 is coupled to node 280, and a second terminal of envelope resistor 264 is coupled to node 282. A first terminal of envelope capacitor 266 is coupled to node 282, and a second terminal of the envelope capacitor 266 is coupled to ground (or another voltage reference). Although the order of the series of components between node 248 and the ground reference node is the envelope inductance 262, the envelope resistor 264, and the envelope capacitor 266 in FIGS. 2A-2E, the order of components in the series circuit could be different, in other embodiments. For example, in FIG. 2F, the envelope resistor 264 is coupled between node 248 and a node 284, the envelope inductance 262 is coupled between node 284 and a node 286, and the envelope capacitor 266 is coupled between node 286 and ground (or another voltage reference).

Referring to FIGS. 2A-2F, and according to an embodiment, the envelope inductance 262, may be implemented as an integrated inductance (e.g., inductance 562, FIGS. 5-7), as a discrete inductor, and/or as a set of bondwires coupling the connection node 248 to the envelope resistor 264 (e.g., via node 280). For example, envelope inductance 262 may be integrally formed as a portion of an integrated passive device (IPD), such as IPD 480, 481, FIGS. 4-7. For example, envelope inductance 262 may have an inductance value in a range between about 5 pH to about 2000 pH. Desirably, envelope inductance 262 has an inductance value less than about 500 pH (e.g., as low as 50 pH, in an embodiment, or possibly even lower). In other embodiments, the value of envelope inductance 262 may be lower or higher than the above-given range.

Envelope resistor 264 may be implemented as an integrated resistor (e.g., resistor 564, FIGS. 5-7), in an embodiment, or as a discrete resistor, in another embodiment. For example, envelope resistor 264 may be integrally formed as a portion of an IPD, such as IPD 480, 481, FIGS. 4-7. In an embodiment, envelope resistor 264 may have a resistance value in a range between about 0.1 ohm to about 5.0 ohm, although envelope resistor 264 may have a resistance value outside of this range, as well.

Envelope capacitor 266 may be implemented as an integrated capacitor (e.g., capacitor 566, FIGS. 5-7), in an embodiment, or as a discrete capacitor (e.g., a "chip capacitor"), in another embodiment. For example, envelope capacitor 266 may be integrally formed as a portion of an IPD, such as IPD 480, 481, FIGS. 4-7. In an embodiment, envelope capacitor 266 may have a capacitance value in a range between about 1 nanofarad (nF) to about 1 microfarad (μF), although envelope capacitor 266 may have a capacitance value outside of this range, as well.

Figure 2C:
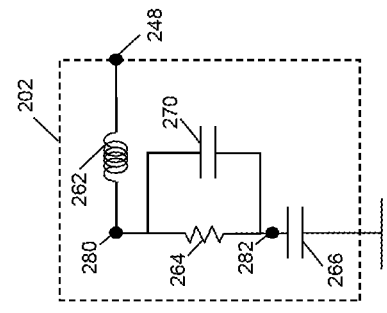
FIGS. 2A, 2B, 2C, 2D, 2E, and 2F illustrate various example embodiments of video bandwidth circuits.
Figure 2F:
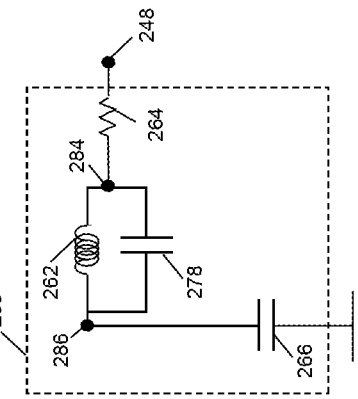
Figure 2B:
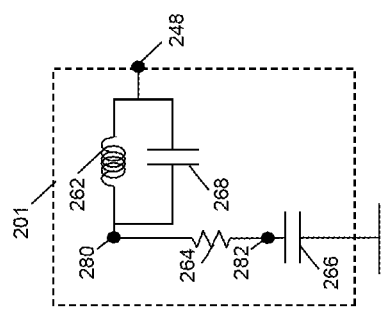
Figure 2E:
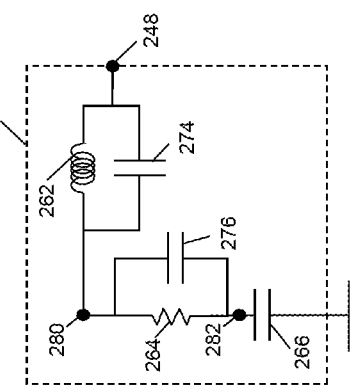
Figure 2A:
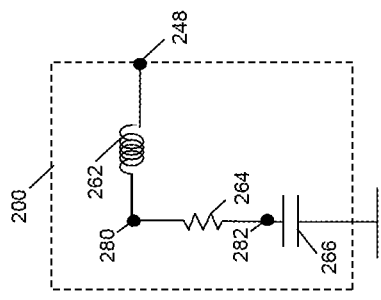

The first embodiment of video bandwidth circuit 200 illustrated in FIG. 2A includes a simple series combination of envelope inductance 262, envelope resistor 264, and envelope capacitor 266. Conversely, in the embodiments of FIGS. 2B-2F, the video bandwidth circuit 201-205 may include one or more "bypass" or "parallel" capacitors 268, 270, 272, 274, 276, 278, $C_{para}$, which are coupled in parallel with the envelope inductance 262 and/or the envelope resistor 264. Each of the bypass capacitors 268, 270, 272, 274, 276, 278 may be implemented as a discrete capacitor (e.g., capacitor 578, FIGS. 4-7), in some embodiments, or as an integrated capacitor, in other embodiments. In each of these embodiments, a bypass capacitor 268, 270, 272, 274, 276, 278 may have a capacitance value in a range between about 3.0 pF to about 1300 pF. In other embodiments, the value of any of bypass capacitors 268, 270, 272, 274, 276, 278 may be lower or higher than the above-given range.

In the video bandwidth circuit 201 of FIG. 2B, bypass capacitor 268, $C_{para}$, is coupled in parallel with the envelope inductance 262. More specifically, first terminals of envelope inductance 262 and bypass capacitor 268 are coupled to node 248, and second terminals of envelope inductance 262 and bypass capacitor 268 are coupled to node 280.

In the video bandwidth circuit 202 of FIG. 2C, bypass capacitor 270, $C_{para}$, is coupled in parallel with the envelope resistor 364. More specifically, first terminals of envelope resistor 264 and bypass capacitor 270 are coupled to node 280, and second terminals of envelope resistor 264 and bypass capacitor 270 are coupled to node 282.

Figure 2D:
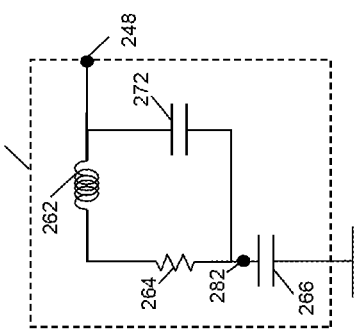

In the video bandwidth circuit 203 of FIG. 2D, bypass capacitor 272, $C_{para}$, is coupled in parallel with the envelope inductance 262 and envelope resistor 264. More specifically, bypass capacitor 272 is coupled across nodes 248 and 282.

In the video bandwidth circuit 204 of FIG. 2E, a first bypass capacitor 274, $C_{para1}$, is coupled in parallel with the envelope inductance 262, and a second bypass capacitor 276, $C_{para2}$, is coupled in parallel with the envelope resistor 264. More specifically, first terminals of envelope inductance 262 and first bypass capacitor 274 are coupled to node 248, and second terminals of envelope inductance 5262 and first bypass capacitor 274 are coupled to node 280. In addition, first terminals of envelope resistor 264 and second bypass capacitor 276 coupled to node 280, and second terminals of envelope resistor 264 and second bypass capacitor 276 are coupled to node 282.

Referring to the video bandwidth circuits 201, 204, and 205 of FIGS. 2B, 2E, and 2F, parallel-coupled inductance 262 and capacitor 268, 274 or 278 form a parallel resonant circuit at frequencies in proximity to the center operational frequency of the device or circuit (e.g., circuit 100) within which circuit 201, 204 or 205 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}//C_{para}$ form a parallel resonant circuit at frequencies in proximity to the center operational frequency of the device, the parallel resonant circuit $L_{env}//C_{para}$ essentially appears as an open circuit to such frequencies. Accordingly, RF energy near the center operational frequency that may be present at the node 248 to which circuit 201, 204 or 205 is coupled will be deflected by the parallel resonant circuit $L_{env}//C_{para}$. This deflection may be provided even using a relatively low inductance value for inductance 262. For these reasons, circuits 201, 204, and 205 may significantly improve the LFR of a device or circuit (e.g., circuit 100) in which it is incorporated by presenting a low impedance at envelope frequencies and a high impedance at RF frequencies.

In each of the embodiments of video bandwidth circuits 202, 203, 204 of FIGS. 2C, 2D, and 2E, bypass capacitor 270, 272 or 276 is coupled in parallel with envelope resistor 264. Because capacitor 270, 272 or 276 may function to route RF current around the envelope resistor 264, circuits 202, 203, 204 may result in a reduction in the RF current dissipated by the envelope resistor 264. This characteristic of circuits 202, 203, 204 also may serve to better protect the envelope resistor 264 from potential compromise due to excessive current that may otherwise flow through the envelope resistor 264 in the absence of bypass capacitor 270, 272 or 276.

Each of circuits 201-205 may increase the device efficiency, when compared with circuit 200, since they allow less RF current to flow through (and be dissipated by) the envelope resistor 264. Further, because circuits 201-205 present a high impedance to RF frequencies in proximity to the center operational frequency of a device into which the video bandwidth circuit is incorporated, it is not as important for circuits 201-205 to be connected to an RF low-impedance point (e.g., RF low-impedance point 148, FIG. 1), although they may be. Instead, the benefits of circuits 201-205 may be achieved even when circuits 201-205 are coupled to a node that shows high RF impedance. This includes other nodes in both the input and output impedance matching circuits.

The RF amplifier circuit 100 of FIG. 1 may be utilized as a single-path amplifier, which receives an RF signal at input 102, amplifies the signal through transistor 130, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 3:
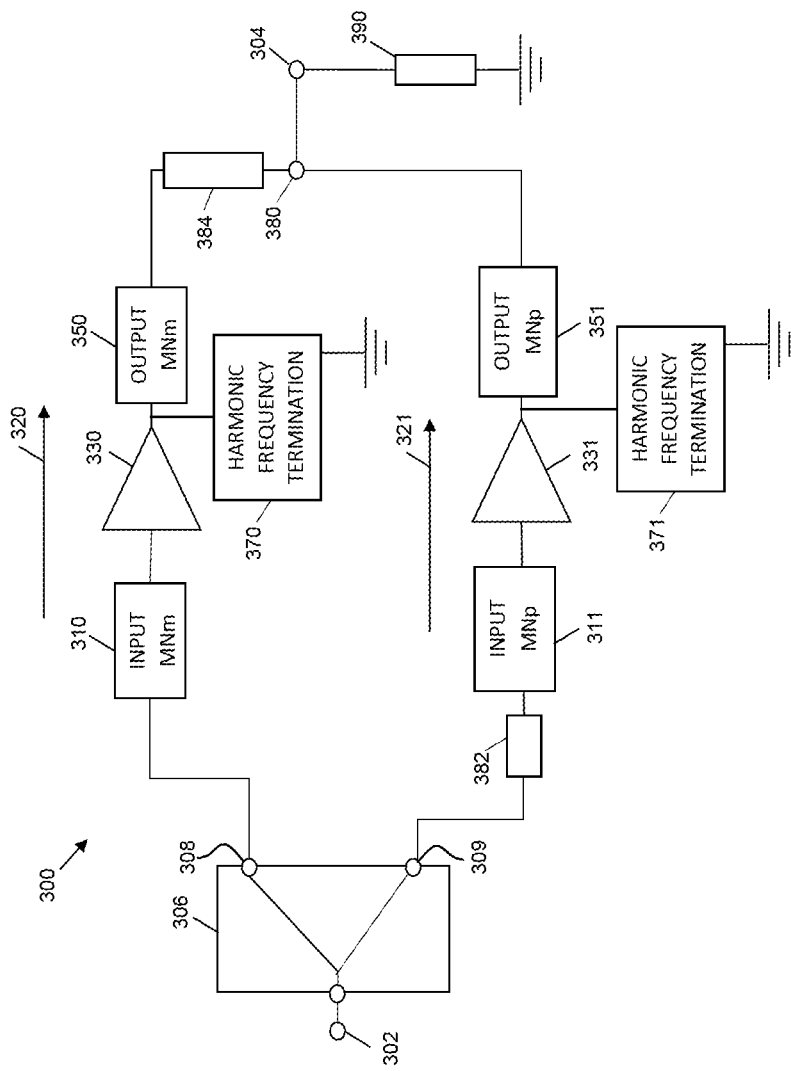
FIG. 3 is a simplified schematic diagram of a Doherty power amplifier, in accordance with an example embodiment.

For example, FIG. 3 is a simplified schematic diagram of a Doherty power amplifier 300 in which embodiments of RF power amplifier circuit 100 may be implemented. Amplifier 300 includes an input node 302, an output node 304, a power divider 306 (or splitter), a main amplifier path 320, a peaking amplifier path 321, and a combining node 380. A load 390 may be coupled to the combining node 380 (e.g., through an impedance transformer, not shown) to receive an amplified RF signal from amplifier 300.

Power divider 306 is configured to divide the power of an input RF signal received at input node 302 into main and peaking portions of the input signal. The main input signal is provided to the main amplifier path 320 at power divider output 308, and the peaking input signal is provided to the peaking amplifier path 321 at power divider output 309. During operation in a full-power mode when both the main and peaking amplifiers 330, 331 are supplying current to the load 390, the power divider 306 divides the input signal power between the amplifier paths 320, 321. For example, the power divider 306 may divide the power equally, such that roughly one half of the input signal power is provided to each path 320, 321 (e.g., for a symmetric Doherty amplifier configuration). Alternatively, the power divider 306 may divide the power unequally (e.g., for an asymmetric Doherty amplifier configuration).

Essentially, the power divider 306 divides an input RF signal supplied at the input node 302, and the divided signals are separately amplified along the main and peaking amplifier paths 320, 321. The amplified signals are then combined in phase at the combining node 380. It is important that phase coherency between the main and peaking amplifier paths 320, 321 is maintained across a frequency band of interest to ensure that the amplified main and peaking signals arrive in phase at the combining node 380, and thus to ensure proper Doherty amplifier operation.

Each of the main amplifier 330 and the peaking amplifier 331 includes one or more single-stage or multiple-stage power transistor integrated circuits (ICs) (or power transistor die) for amplifying an RF signal conducted through the amplifier 330, 331. According to various embodiments, all amplifier stages or a final amplifier stage of either or both the main amplifier 330 and/or the peaking amplifier 331 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 330 or the peaking amplifier 331 is implemented as a III-V FET, the other amplifier may be implemented as a silicon-based FET (e.g., an LDMOS FET), in some embodiments.

Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 300, the main amplifier 330 is biased to operate in class AB mode, and the peaking amplifier 331 is biased to operate in class C mode. At low power levels, where the power of the input signal at node 302 is lower than the turn-on threshold level of peaking amplifier 331, the amplifier 300 operates in a low-power (or back-off) mode in which the main amplifier 330 is the only amplifier supplying current to the load 390. When the power of the input signal exceeds a threshold level of the peaking amplifier 331, the amplifier 300 operates in a high-power mode in which the main amplifier 330 and the peaking amplifier 331 both supply current to the load 390. At this point, the peaking amplifier 331 provides active load modulation at combining node 380, allowing the current of the main amplifier 330 to continue to increase linearly.

Input and output impedance matching networks 310, 350 (input MNm, output MNm) may be implemented at the input and/or output of the main amplifier 330. Similarly, input and output impedance matching networks 311, 351 (input MNp, output MNp) may be implemented at the input and/or output of the peaking amplifier 331. In each case, the matching networks 310, 311, 350, 351 may be used to incrementally increase the circuit impedance toward the load impedance and source impedance. All or portions of the input and output impedance matching networks 310, 311, 350, 351 may be implemented inside a power transistor package that includes the main and/or peaking amplifiers 330, 331, or some portions of the input and output impedance matching networks 310, 311, 350, 351 may be implemented on a PCB or other substrate to which a power transistor package is mounted.

In addition, as will be described in detail later, embodiments of the inventive subject matter include harmonic frequency termination circuits 370, 371 coupled between the outputs of amplifiers 330, 331 and a ground reference. The harmonic frequency termination circuits 370, 371 are configured to control the harmonic impedance across a relatively wide fractional bandwidth. For example, the harmonic frequency termination circuits 370, 371 may provide a low impedance path to ground for signal energy at the second harmonic of the center frequency of operation, fo, of the amplifier 300 (also referred to herein as the "fundamental frequency" of operation).

Doherty amplifier 300 has a "non-inverted" load network configuration. In the non-inverted configuration, the input circuit is configured so that an input signal supplied to the peaking amplifier 331 is delayed by 90 degrees with respect to the input signal supplied to the main amplifier 330 at the center frequency of operation, fo, of the amplifier 300. To ensure that the main and peaking input RF signals arrive at the main and peaking amplifiers 330, 331 with about 90 degrees of phase difference, as is fundamental to proper Doherty amplifier operation, phase delay element 382 applies about 90 degrees of phase delay to the peaking input signal. For example, phase delay element 382 may include a quarter wave transmission line, or another suitable type of delay element with an electrical length of about 90 degrees.

To compensate for the resulting 90 degree phase delay difference between the main and peaking amplifier paths 320, 321 at the inputs of amplifiers 330, 331 (i.e., to ensure that the amplified signals arrive in phase at the combining node 380), the output circuit is configured to apply about a 90 degree phase delay to the signal between the output of main amplifier 330 and the combining node 380. This is achieved through an additional delay element 384. Alternate embodiments of Doherty amplifiers may have an "inverted" load network configuration. In such a configuration, the input circuit is configured so that an input signal supplied to the main amplifier 330 is delayed by about 90 degrees with respect to the input signal supplied to the peaking amplifier 331 at the center frequency of operation, fo, of the amplifier 300, and the output circuit is configured to apply about a 90 degree phase delay to the signal between the output of peaking amplifier 331 and the combining node 380.

Amplifiers 330 and 331, along with portions of matching networks 310, 311, 350, 351 may be implemented in discrete, packaged power amplifier devices. In such devices, input and output leads are coupled to a substrate, and each amplifier 330, 331 may include a single-stage or multi-stage power transistor also coupled to the substrate. Portions of the input and output matching networks 310, 311, 350, 351 may be implemented as additional components within the packaged device. Further, as is described in detail below, the video bandwidth circuits (e.g., embodiments of VBW circuit 160, FIG. 1, illustrated in FIGS. 2A-2F) and the harmonic termination circuits (e.g., harmonic termination circuit 170, FIG. 1) also may be implemented as additional components within the packaged device.

Figure 4:
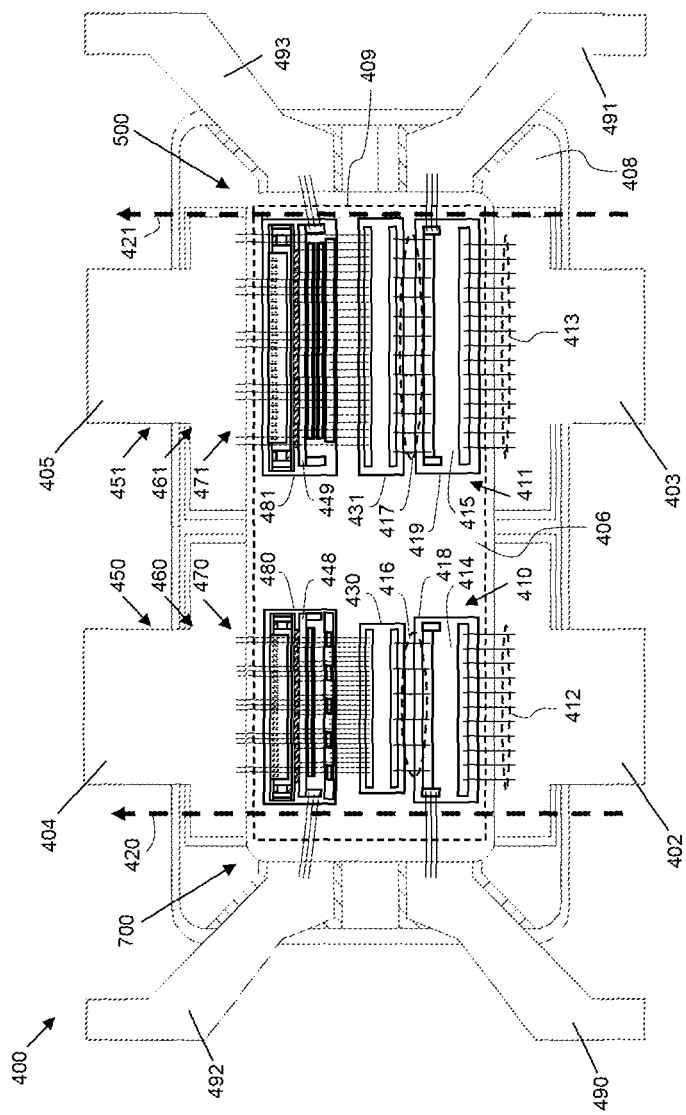
FIG. 4 is a top view of a packaged RF power amplifier device that includes two parallel amplification paths, in accordance with an example embodiment.

For example, FIG. 4 is a top view of an embodiment of a packaged RF amplifier device 400 that embodies two parallel instances of the circuit 100 of FIG. 1, and which may be utilized to provide amplifiers (e.g., amplifiers 330, 331, FIG. 3), and portions of matching networks (e.g., portions of matching networks 310, 311, 350, 351, FIG. 3) in a Doherty amplifier (e.g., Doherty amplifier 300, FIG. 3). In addition, as will be described in more detail below, device 400 includes two output-side IPD assemblies 480, 481, each of which includes portions of an output impedance matching circuit 450, 451 (e.g., circuit 150, 350, 351 FIGS. 1, 3), a video bandwidth circuit 460, 461 (e.g., circuit 160, FIG. 1), and a harmonic termination circuit 470, 471 (e.g., circuit 170, 370, 371, FIGS. 1, 3).

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for transistor dies 430, 431 and other devices mounted on flange 406. Flange 406 has top and bottom surfaces (only a central portion of the top surface is visible in FIG. 4), and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. Isolation structure 408, which is formed from a rigid, electrically insulating material, provides electrical isolation between conductive features of the device (e.g., between leads 402-405 and flange 406). Isolation structure 408 has a frame shape, in an embodiment, which includes a substantially enclosed, four-sided structure with a central opening. Isolation structure 408 may have a substantially rectangular shape, as shown in FIG. 4, or isolation structure 408 may have another shape (e.g., annular ring, oval, and so on).

A portion of the top surface of flange 406 that is exposed through the opening in isolation structure 408 is referred to herein as the "active area" of device 400. Transistor dies 430, 431 are positioned within the active device area of device 400, along with IPD assemblies 418, 419, 480, 481, which will be described in more detail later. For example, the transistor dies 430, 431 and IPD assemblies 418, 419, 480, 481 may be coupled to the top surface of flange 406 using conductive epoxy, solder, solder bumps, sintering, and/or eutectic bonds.

Device 400 houses two amplification paths (indicated with arrows 420, 421), where each amplification path 420, 421 represents a physical implementation of circuit 100 (FIG. 1). When incorporated into a Doherty amplifier (e.g., Doherty amplifier 300, FIG. 3), amplification path 420 may correspond to a main amplifier path (e.g., main amplifier path 320, FIG. 3), and amplification path 421 may correspond to a peaking amplifier path (e.g., peaking amplifier path 321, FIG. 3).

Each path 420, 421 includes an input lead 402, 403 (e.g., input 102, FIG. 1), an output lead 404, 405 (e.g., output 104, FIG. 1), one or more transistor dies 430, 431 (e.g., transistor 130, FIG. 1 or amplifiers 330, 331, FIG. 3), an input impedance matching circuit 410, 411 (e.g., input impedance matching circuit 110, FIG. 1 or portions of input matching networks 310, 311, FIG. 3), an output impedance matching circuit 450, 451 (e.g., output impedance matching circuit 150, FIG. 1 or portions of output matching networks 350, 351, FIG. 3), an output-side video bandwidth circuit 460, 461 (e.g., video bandwidth circuit 160, FIG. 1), and a harmonic termination circuit 470, 471 (e.g., harmonic termination circuit 170, 370, 371, FIGS. 1, 3).

The input and output leads 402-405 are mounted on a top surface of the isolation structure 408 on opposed sides of the central opening, and thus the input and output leads 402-405 are elevated above the top surface of the flange 406, and are electrically isolated from the flange 406. Generally, the input and output leads 402-405 are oriented to allow for attachment of bondwires between the input and output leads 402-405 and components and elements within the central opening of isolation structure 408.

Each transistor die 430, 431 includes an integrated power FET, where each FET has a control terminal (e.g., a gate) and two current conducting terminals (e.g., a drain and a source). A control terminal of a FET within each transistor die 430, 431 is coupled through an input impedance matching circuit 410, 411 to an input lead 402, 403. In addition, one current conducting terminal (e.g., the drain) of a FET within each transistor die 430, 431 is coupled through an output impedance matching circuit 450, 451 to an output lead 404, 405. The other current conducting terminal (e.g., the source) of a FET within each transistor die 430, 431 is electrically coupled through the die 430, 431 to the flange 406 (e.g., to ground), in an embodiment.

Each input impedance matching circuit 410, 411 is coupled between an input lead 402, 403 and the control terminal of a FET within a transistor die 430, 431. In the device 400 of FIG. 4, each input impedance matching circuit 410, 411 includes two inductive elements 412, 413, 416, 417 (e.g., inductive elements 112, 116, FIG. 1) and a shunt capacitor 414, 415 (e.g., capacitor 114, FIG. 1). The shunt capacitor 414, 415 of each input impedance matching circuit 410, 411 may be included in an IPD assembly 418, 419, according to an embodiment. For example, the shunt capacitors 414, 415 may be implemented as metal-insulator-metal (MIM) capacitors within IPD assemblies 418, 419. In other embodiments, the shunt capacitor may not form a portion of an IPD assembly, but instead may be a discrete capacitor, or a capacitor that is formed in another type of assembly (e.g., an LTCC assembly). In still other alternate embodiments, each shunt capacitor may be integrated into the transistor die 430, 431.

Each inductive element 412, 413, 416, 417 is formed from a plurality of parallel, closely-spaced sets of bondwires, in an embodiment. For example, in each path 420, 421, a first inductive element 412, 413 (e.g., inductive element 112, FIG. 1) includes a plurality of bondwires coupled between an input lead 402, 403 and a first terminal of the shunt capacitor 414, 415, and a second inductive element 416, 417 (e.g., inductive element 116, FIG. 1) includes a plurality of bondwires coupled between the first terminal of the shunt capacitor 414, 415 and the control terminal of a FET within transistor die 430, 431. The second terminal of each shunt capacitor 414, 415 is electrically coupled through the IPD assembly 418, 419 to the flange 406 (e.g., to ground).

Embodiments of the output impedance matching circuits 450, 451, video bandwidth circuits 460, 461, and harmonic termination circuits 470, 471 will be described in more detail in conjunction with FIGS. 5-7, which illustrate the components of these circuits 450, 451, 460, 461, 470, 471 in greater detail. Briefly, each output impedance matching circuit 450, 451 is coupled between a current conducting terminal (e.g., the drain) of a FET within a transistor die 430, 431 and an output lead 404, 405. Each video bandwidth circuit 460, 461 is coupled between a node 448, 449 (e.g., an RF low-impedance point in the form of a conductive bond pad) within IPD assembly 480, 481 and a ground reference (e.g., flange 406). Each harmonic termination circuit 470, 471 is coupled between the current conducting terminal (e.g., the drain) of a FET within a transistor die 430, 431 and the ground reference (e.g., flange 406).

In addition to the input and output leads 402-405, device 400 also may include bias leads 490, 491, 492, 493. Input-side bias leads 490, 491 are electrically coupled through bondwires and other conductors to a control terminal of a FET within each transistor die 430, 431. Conversely, output-side bias leads 492, 493 are electrically coupled through bondwires (e.g., bondwires 590, 790, FIGS. 5, 7) and other conductors to a current conducting terminal (e.g., the drain) of a FET within each transistor die 430, 431. Bias leads 490, 491 may be electrically coupled to a first external bias circuit (not shown), which provides a bias voltage to the control terminal of each FET through the bias leads 490, 491. Similarly, bias leads 492, 493 may be electrically coupled to a second external bias circuit (not shown), which provides a bias voltage to the current conducting terminal of each FET through the bias leads 492, 493. In other embodiments, either or both the input-side or output-side bias leads 490-493 may be excluded.

In the example of FIG. 4, device 400 includes two transistor dies 430, 431 that essentially function in parallel, although another semiconductor device may include a single transistor die or more than two transistor dies, as well. In addition, device 400 includes two input-side IPD assemblies 418, 419 and two output-side IPD assemblies 480, 481, which also essentially function in parallel. It is to be understood that more or fewer of IPD assemblies 418, 419, 480, 481 may be implemented, as well.

According to an embodiment, device 400 is incorporated in an air cavity package, in which transistor dies 430, 431, the IPD assemblies 418, 419, 480, 481, and various other components are located within an enclosed air cavity. Basically, the air cavity is bounded by flange 406, isolation structure 408, and a cap (not shown) overlying and in contact with the isolation structure 408 and leads 402-405. In FIG. 4, an example perimeter of the cap is indicated by dashed box 409. In other embodiments, the components of device 400 may be incorporated into an overmolded package (i.e., a package in which the electrical components within the active device area are encapsulated with a non-conductive molding compound, and in which portions of the leads 402-405 also may be encompassed by the molding compound). In an overmolded package, isolation structure 408 may be excluded.

Figure 5:
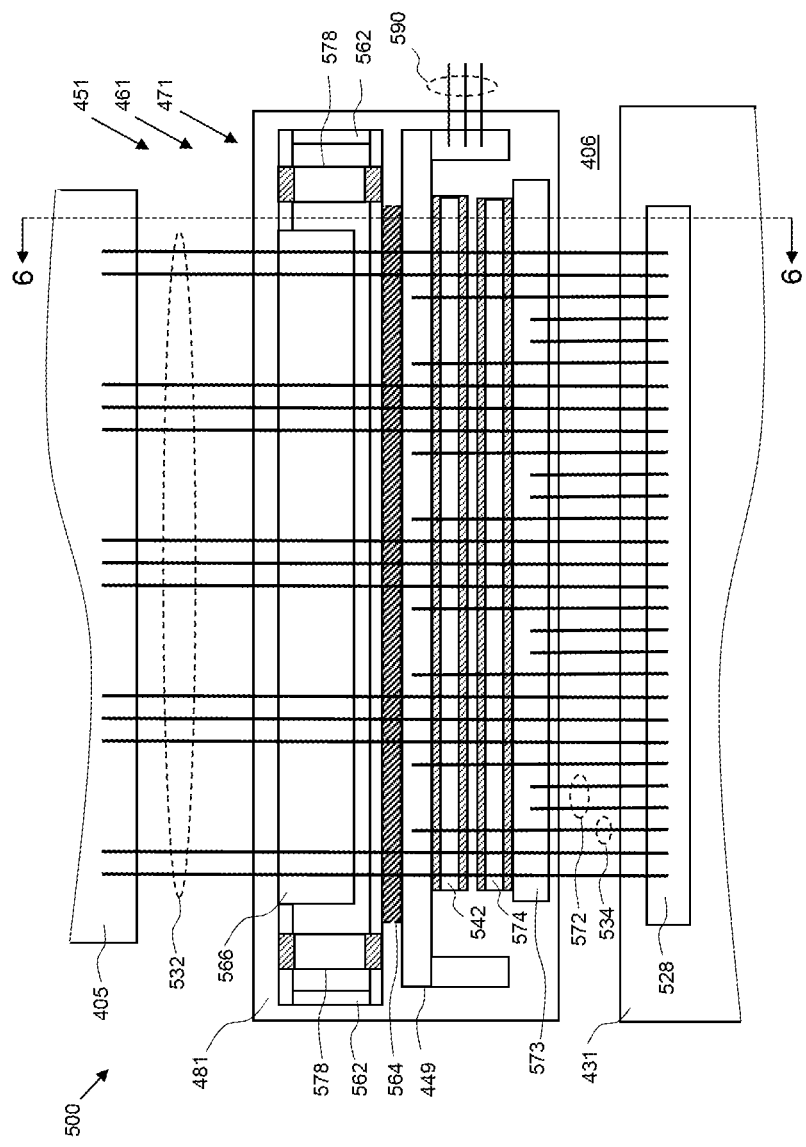
FIG. 5 is a top view of a portion of a packaged RF power amplifier device, including a portion of a power transistor and an output impedance matching circuit, in accordance with an example embodiment.
Figure 6:
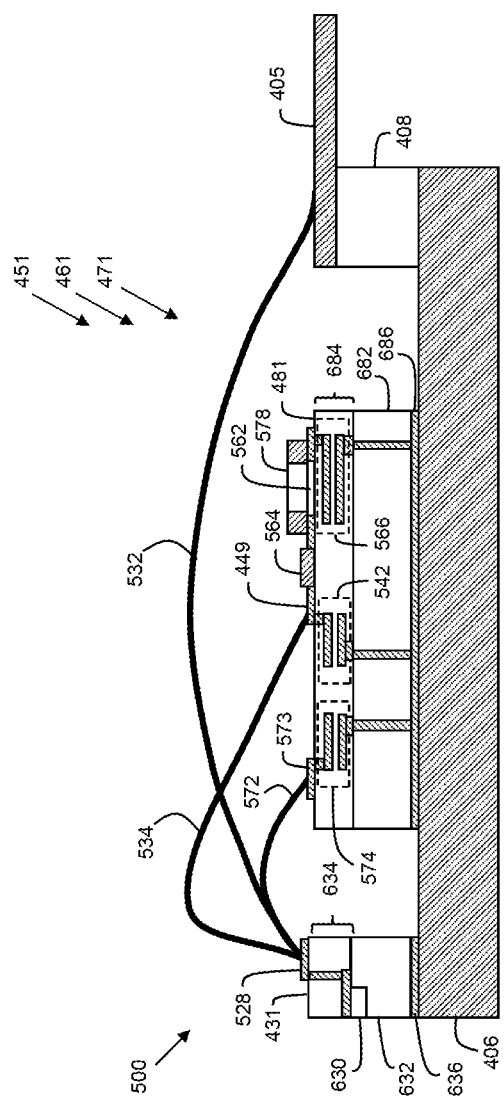
FIG. 6 is a cross-sectional, side view of the portion of the RF power amplifier device of FIG. 5 along line 6-6, in accordance with an example embodiment.
Figure 7:
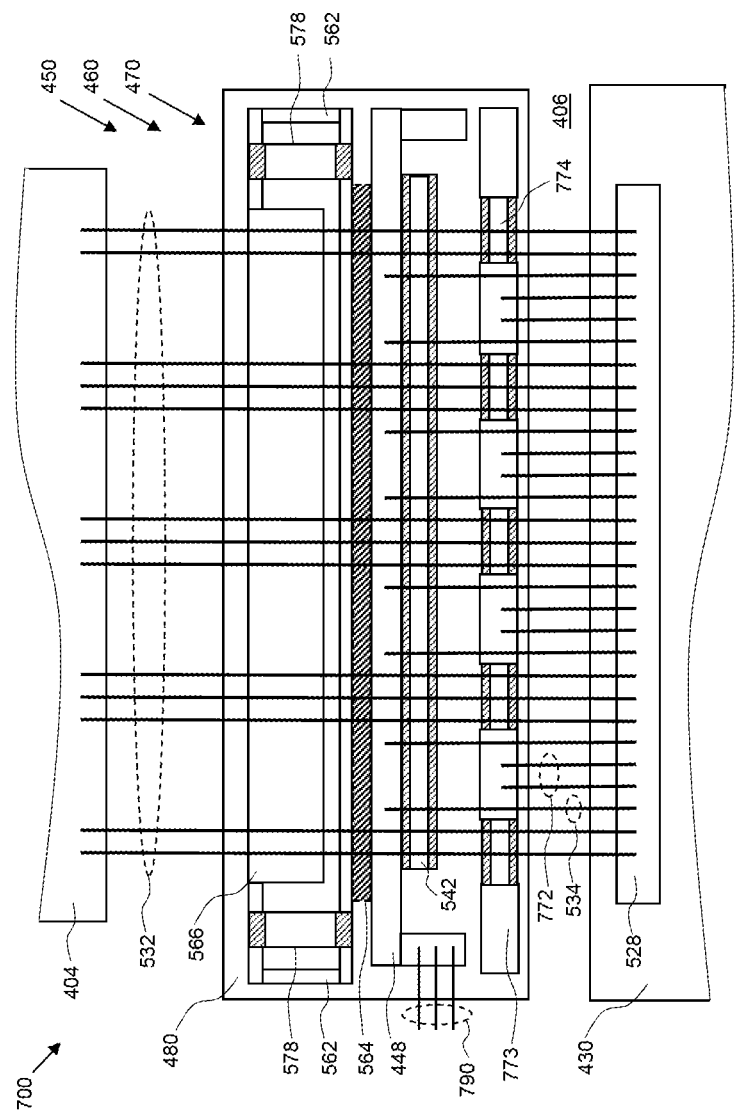
FIG. 7 is a top view of a portion of a packaged RF power amplifier device, including a portion of a power transistor and an output impedance matching circuit, in accordance with another example embodiment.

Reference is now made to FIGS. 5-7, which include enlarged views of portions of device 400 (FIG. 4) that include embodiments of the output impedance matching circuits 450, 451, video bandwidth circuits 460, 461, and harmonic termination circuits 470, 471. More specifically, FIG. 5 is a top view of the upper-right, output-side portion 500 of packaged RF power amplifier device 400 along amplifier path 421, and FIG. 7 is a top view of the upper-left, output-side portion 700 of packaged RF power amplifier device 400 along amplifier path 420. Portion 500 (FIG. 5) includes a portion of power transistor die 431, a portion of output lead 405, and output-side IPD assembly 481. Similarly, portion 700 (FIG. 7) includes a portion of power transistor die 430, a portion of output lead 404, and output-side IPD assembly 480, in accordance. For enhanced understanding, FIG. 6 includes a cross-sectional, side view of the portion 500 of the RF power amplifier device of FIG. 5 along line 6-6, in accordance with an example embodiment. More specifically, FIG. 6 is a cross-sectional view through a portion of flange 406, transistor die 431, IPD assembly 481, and output lead 405.

As will be explained in more detail later, the embodiments of FIGS. 5 and 7 differ primarily in the configuration of the IPD assemblies 480, 481, and more specifically in the configuration of integrated capacitors (e.g., capacitors 574, 774, FIGS. 5, 7) utilized in the harmonic termination circuits 470, 471. The other substantially similar components of the IPD assemblies 480, 481 of FIGS. 5 and 7 are labeled with identical reference numbers, and for the purpose of brevity, the description of those substantially similar components are not repeated. Further, although FIGS. 4-7 depict embodiments of two differently-configured IPDs 480, 481 utilized in device 400, those of skill in the art would understand, based on the description herein, that a device may include substantially similar IPDs in both amplification paths 420, 421. In other words, an alternate embodiment of device 400 may include output-side IPDs in both paths 420, 421 that have the configuration of IPD 480, or another alternate embodiment of device 400 may include output-side IPDs in both paths 420, 421 that have the configuration of IPD 481.

As mentioned above, each of FIGS. 5-7 show a portion of a power transistor die 430, 431, a portion of an output lead 404, 405, and an output-side IPD assembly 480, 481. As also discussed previously, and as most clearly illustrated in FIG. 6, the power transistor die 430, 431 and the IPD assemblies 480, 481 are coupled to a conductive flange 406, and the output leads 404, 405 are electrically isolated from the conductive flange 406 (e.g., using an isolation structure 408).

Each power transistor die 430, 431 includes a transistor output terminal 528 (e.g., a conductive bond pad), which is electrically connected within each power transistor die 430, 431 to a first current-conducting terminal (e.g., a drain terminal) of a single-stage or final-stage FET 630 integrated within the die 430, 431. As discussed previously, each FET 630 may include a III-V field effect transistor (e.g., a HEMT), such as a GaN FET (or another type of III-V transistor, including a GaAs FET, a GaP FET, an InP FET, or an InSb FET). More specifically, each FET 630 may be integrally formed in and on a base semiconductor substrate 632 (e.g., a GaN substrate, a GaN-on-silicon substrate, a GaN-on-silicon carbide substrate, and so on). Conductive connections between the first current-conducting terminal of the FET 630 (e.g., the drain terminal) and the output terminal 528 of the die 430, 431 may be made through a build-up structure 634 of alternating dielectric and patterned conductive layers, where portions of the patterned conductive layers are electrically connected using conductive vias. The second current-conducting terminal (e.g., the source terminal) may be electrically connected to the conductive flange 406 using through substrate vias or doped sinker regions (not shown) to a conductive layer 636 on a bottom surface of the die 430, 431.

Each IPD assembly 480, 481 also may include a base semiconductor substrate 682 (e.g., a silicon substrate, a silicon carbide substrate, a GaN substrate, or another type of semiconductor substrate, which may be referred to as an "IPD substrate" herein) and a build-up structure 684 of alternating dielectric and patterned conductive layers, where portions of the patterned conductive layers are electrically connected using conductive vias. As will be discussed in more detail below, various electrical components of the output impedance matching circuits 450, 451, the video bandwidth circuits 460, 461, and the harmonic termination circuits 470, 471 are integrally formed within and/or connected to the IPD assemblies 480, 481. These electrical components may be electrically connected to conductive bond pads (e.g., bond pads 448, 449, 573, 773) at the top surface of the IPD assemblies 480, 481, and also may be electrically connected to the conductive flange 406 (e.g., to ground) using through substrate vias to a conductive layer 686 on a bottom surface of the IPD assembly 480, 481.

In some embodiments, each IPD assembly 480, 481 more specifically includes a first shunt capacitor 542 (e.g., shunt capacitance 142, FIG. 1) of an output impedance matching circuit (e.g., circuit 150, FIG. 1 or 450, 451, FIG. 4), a second shunt capacitor 574 (e.g., shunt capacitance 174, FIG. 1) of a harmonic termination circuit (e.g., circuit 170, FIG. 1 or 470, 471, FIG. 4), and components of a video bandwidth circuit (e.g., circuit 160, FIG. 1, one of circuits 200-205, FIGS. 2A-2F, or 460, 461). In the embodiments of FIGS. 5-7, the components of the video bandwidth circuit included in each IPD assembly 480, 481 more specifically include an envelope resistor 564 (e.g., resistor 264, FIGS. 2A-2F), an envelope inductor 562 (e.g., inductor 262, FIGS. 2A-2F), an envelope capacitor 566 (e.g., capacitor 266, FIGS. 2A-2F), and a bypass capacitor 578 (e.g., bypass capacitor 278, FIG. 2F). Each of these components will be discussed in more detail later.

First, connections between the transistor dies 430, 431 and the output leads 404, 405 through the output impedance matching circuits 450, 451 will be described in more detail. More specifically, through the output terminal 528, the first current conducting terminal (e.g., the drain) of a FET within each transistor die 430, 431 is electrically coupled to an output lead 404, 405 through an instance of an output impedance matching circuit 450, 451. For example, in an embodiment, each output impedance matching circuit 450, 451 may include two inductive elements 532, 534 (e.g., inductive elements 132, 134, FIG. 1) and a shunt capacitor 542 (e.g., shunt capacitance 142, FIG. 1). A first inductive element 532 (e.g., inductive element 132, FIG. 1) may be implemented as a first set of bondwires that are coupled between the output terminal 528 of each die 430, 431 and an output lead 404, 405. A second inductive element 534 (e.g., inductive element 134, FIG. 1) may be implemented as a second set of bondwires that are coupled between the output terminal 528 of each die 430, 431 and a conductive bond pad 448, 449 on a top surface of the IPD assembly 480, 481. To avoid cluttering FIGS. 5 and 7, only one bondwire in the set of bondwires comprising inductive element 534 is circled and numbered with reference number 534. It should be understood that inductive element 534 includes all bondwires coupled between the output terminal 528 and bond pad 448, 449. For example, the conductive bond pads 448, 449 may correspond to RF low-impedance point nodes (e.g., node 148, FIG. 1), in an embodiment.

In an embodiment, the first ends of bondwires 590, 790 also may be connected to the conductive bond pad 448, 449, where the second ends of bondwires 590, 790 are connected to a bias lead (e.g., bias lead 492, 493, FIG. 4). When a bias voltage is provided by an external bias circuit to the bias lead, the bias voltage may be conveyed through bondwires 590, 790, conductive landing pad 448, 449, bondwires 534, and conductive landing pad 528 to the drain of the FET within a transistor die 430, 431.

According to an embodiment, the shunt capacitor 542 of each output impedance matching circuit 450, 451 may be implemented as a capacitor (or a set of parallel-coupled capacitors) that is integrally formed with the IPD substrate of IPD assembly 480, 481. For example, shunt capacitor 542 may be implemented as an integrated MIM capacitor, which includes first and second conductive electrodes (formed from patterned portions of the conductive layers of build-up structure 684) that are aligned with each other and electrically separated by dielectric material of the build-up structure 684. A first electrode (or terminal) of the shunt capacitor 542 is electrically coupled to the conductive bond pad 448, 449 (and thus to bondwires 534), and a second electrode (or terminal) of the shunt capacitor 542 is electrically coupled to the conductive flange (e.g., using conductive through substrate vias that extend through the semiconductor substrate 682), in an embodiment. In a more specific embodiment, the first electrode of the shunt capacitor 542 is "directly connected" to the bond pad 448, where "directly connected" means electrically connected, possibly with one or more conductive traces and/or conductive vias, but without intervening circuit elements (i.e., circuit elements that have more than a trace inductance, where a "trace inductance" is an inductance less than about 100 pH). Because the shunt capacitor 542 and the bond pad 448 are "directly connected," and the bond pad 448 also has only a trace inductance, in an embodiment, the bondwires 534 and the shunt capacitor 542 also may be considered to be "directly connected." In an alternate embodiment, the shunt capacitor 542 may be implemented using a discrete capacitor coupled to a top surface of the IPD assembly 480, 481, or using another type of capacitor.

As just explained, the shunt inductor 534 and the shunt capacitor 542 are electrically coupled in series between a current conducting terminal of the power transistor within die 430, 431 and the flange 406 (e.g., ground). As mentioned previously in conjunction with FIG. 1, this combination of impedance matching elements may function as a first (high-pass) matching stage. According to an embodiment, shunt inductor 534 may have an inductance value in a range between about 100 pH to about 3 nH, and shunt capacitor 542 may have a capacitance value in a range between about 30 pF to about 500 pF, although these components may have values outside of these ranges, as well.

As mentioned above, a video bandwidth circuit 460, 461 is included in each IPD assembly 480, 481, in an embodiment. Each video bandwidth circuit 460, 461 may have any one of a number of configurations, in various embodiments, such as but not limited to one of the configurations illustrated in FIGS. 2A-2F. In the embodiment illustrated in FIGS. 5-7, which corresponds to the video bandwidth circuit 205 of FIG. 2F, each video bandwidth circuit 460, 461 includes a series combination of an envelope resistor 564 (e.g., resistor 264, FIG. 2F), an envelope inductor 562 (e.g., inductor 262, FIG. 2F), and an envelope capacitor 566 (e.g., capacitor 266, FIG. 2F) electrically connected between node 448, 449 (e.g., node 148, 248, FIGS. 1, 2F, which may correspond to an RF low-impedance point) and a ground reference (e.g., flange 406). In addition, each video bandwidth circuit 460, 461 includes a bypass capacitor 578 (e.g., bypass capacitor 278, FIG. 2F) connected in parallel with envelope inductor 562. In the embodiments of FIGS. 5-7, two instances of the parallel combination of envelope inductor 562 and bypass capacitor 578 are implemented on opposite sides of the IPD assemblies 480, 481. More specifically, the parallel combinations of envelope inductor 562 and capacitor 578 are connected in parallel between envelope resistor 564 and envelope capacitor 566, in the illustrated embodiment. In an alternate embodiment, the video bandwidth circuits 460, 461 may include only one instance of the combination of envelope inductor 562 and capacitor 578, or more than two instances of the combination of envelope inductor 762 and capacitor 778.

In the embodiments of FIGS. 5-7, envelope resistor 564 is integrally formed as part of the IPD assembly 480, 481. For example, each envelope resistor 564 may be a polysilicon resistor formed from a layer of polysilicon on or within build-up structure 684, and electrically coupled between node 448, 449 and the parallel combination of envelope inductor 562 and bypass capacitor 578. In other alternate embodiments, the envelope resistor 564 may be formed from tungsten silicide or another material, may be a thick or thin film resistor, or may be a discrete component coupled to a top surface of IPD assembly 480, 481.

The envelope inductor 562 also may be integrally formed as part of the IPD assembly 480, 481, as is illustrated in the embodiment of FIGS. 5-7. For example, each envelope inductor 562 may be a patterned conductor formed from portion(s) of one or more conductive layers of the build-up structure 684, where a first end of the conductor is electrically coupled to envelope resistor 564, and a second end of the conductor is electrically coupled to a first terminal of envelope capacitor 566. In alternate embodiments, each envelope inductor 562 may be implemented as a plurality of bondwires, or as a spiral inductor (e.g., on or proximate to the top surface of IPD assembly 480, 481), or as a discrete inductor coupled to a top surface of IPD assembly 480, 481.

A bypass capacitor 578 is coupled in parallel with each envelope inductor 562, in an embodiment. Each of the bypass capacitors 578 may be, for example, a discrete capacitor that is connected (e.g., using solder, a conductive epoxy, or other means) to a top surface of IPD assembly 480, 481. More specifically, a first terminal of each bypass capacitor 578 may be electrically coupled to the envelope resistor 564 and to a first terminal of an envelope inductor 562, and a second terminal of each bypass capacitor 578 may be connected to a second terminal of an envelope inductor 562 and to a first terminal of envelope capacitor 566.

For example, each bypass capacitor 578 may be a multiple-layer capacitor (e.g., a multiple-layer ceramic capacitor) with parallel, interleaved electrodes and wrap-around end terminations. Alternatively, each bypass capacitor 578 may form a portion of a separate IPD (e.g., a MIM capacitor formed on a semiconductor substrate), or may be a capacitor that is integrally formed with the semiconductor substrate of the IPD assembly 480, 481. Alternatively, each bypass capacitor 578 may be implemented as some other type of capacitor capable of providing the desired capacitance for the video bandwidth circuit 460, 461.

The envelope capacitor 566 is electrically coupled between a ground reference node (e.g., conductive layer 686 at the bottom surface of each IPD assembly 480, 481) and the parallel combination of envelope inductor 562 and bypass capacitor 578. Capacitor 566 may be a MIM capacitor that is integrally formed with the IPD substrate of IPD assembly 480, 481, for example. In some embodiments, capacitor 566 may be formed in the build-up structure 684 entirely above the semiconductor substrate 682, or capacitor 566 may have portions that extend into the semiconductor substrate 682 or are otherwise coupled to, or in contact with, the semiconductor substrate 682. According to an embodiment, the capacitor 566 may be formed from a first electrode, a second electrode, and a dielectric material between the first and second electrodes. The dielectric material of capacitor 566 may include one or more layers of polysilicon, various oxides, a nitride, or other suitable materials. In various embodiments, the first and second electrodes of capacitor 566 may include horizontal portions of conductive layers (e.g., portions that are parallel to the top and bottom surfaces of IPD assemblies 480, 481) and/or vertical portions (e.g., portions that are parallel to the sides of IPD assemblies 480, 481) of conductive layers that are interconnected. Further, the first and second electrodes of capacitor 566 may be formed from metal layers and/or from conductive semiconductor materials (e.g., polysilicon). Alternatively, each envelope capacitor 566 may be, for example, a discrete capacitor that is connected (e.g., using solder, a conductive epoxy, or other means) to a top surface of the IPD assembly 480, 481. Although particular two-plate capacitor structures are shown in FIG. 6 for capacitors 542, 574, and 566, a variety of other capacitor structures alternatively may be utilized, as would be understood by one of skill in the art based on the description herein.

As discussed previously in conjunction with FIG. 1, a harmonic termination circuit 470, 471 also is connected between the first current conducting terminal (e.g., the drain) of a FET within each transistor die 430, 431 and a ground reference (e.g., to the conductive layer 686 on the bottom surface of IPD assembly 480, 481). In the embodiment of FIGS. 5 and 6, the harmonic termination circuit 471 includes a series combination of a shunt inductance 572 (e.g., shunt inductive element 172, FIG. 1) and a shunt capacitor 574 (e.g., shunt capacitance 174, FIG. 1). The shunt inductance 572 may be implemented as a set of bondwires, where first ends of the bondwires are connected to the output terminal 528 of die 431 (and thus to the first current conducting terminal of the FET), and second ends of the bondwires are connected to a conductive bond pad 573 that is exposed at a top surface of IPD assembly 481. To avoid cluttering FIG. 5, only two bondwires in the set of bondwires comprising inductive element 572 are circled and numbered with reference number 572. It should be understood that inductive element 572 includes all bondwires coupled between the output terminal 528 and bond pads 573. Within IPD assembly 481, the bond pad 573 is electrically connected to a first terminal of shunt capacitor 574, and a second terminal of shunt capacitor 574 is electrically connected (e.g., using through substrate vias) to the ground reference (e.g., to the conductive layer 686 on the bottom surface of IPD assembly 481).

According to an embodiment, the shunt capacitor 574 of harmonic termination circuit 471 may be implemented as a capacitor that is integrally formed with the IPD substrate of the IPD assembly 481. For example, shunt capacitor 574 may be implemented as an integrated MIM capacitor, which includes first and second conductive electrodes (formed from patterned portions of the conductive layers of build-up structure 684) that are aligned with each other and electrically separated by dielectric material of the build-up structure 684. A first electrode (or terminal) of the shunt capacitor 574 is electrically coupled to the conductive bond pad 573, and a second electrode (or terminal) of the shunt capacitor 574 is electrically coupled to the conductive flange (e.g., using through substrate vias), in an embodiment. In a more specific embodiment, the first electrode of the shunt capacitor 574 is "directly connected" (as defined previously) to the bond pad 573. Because the shunt capacitor 574 and the bond pad 573 are "directly connected," and the bond pad 573 also has only a trace inductance, in an embodiment, the bondwires 572 and the shunt capacitor 574 also may be considered to be "directly connected." In an alternate embodiment, the shunt capacitor 574 may be implemented using a discrete capacitor coupled to a top surface of the IPD assembly 481, or using another type of capacitor.

In the embodiment of FIG. 7, the harmonic termination circuit 470 includes a series combination of a shunt inductance 772 (e.g., shunt inductive element 172, FIG. 1) and a plurality of parallel-coupled shunt capacitors 774 (e.g., multiple parallel-coupled shunt capacitors making up shunt capacitance 174, FIG. 1). More specifically, the difference from the embodiment of FIGS. 5 and 6 and the embodiment of FIG. 7 is that, in the embodiment of FIGS. 5 and 6, the harmonic termination circuit 471 included a single shunt capacitor 574, whereas in the embodiment of FIG. 7, the harmonic termination circuit 471 includes multiple, parallel-coupled shunt capacitors 774 that are physically located between adjacent conductive bond pads 773 or next to end bond pads 773.

In the embodiment of FIG. 7, the shunt inductance 772 may be implemented as multiple sets of bondwires, where first ends of the bondwires are connected to the output terminal 528 of die 430 (and thus to the first current conducting terminal of the FET), and second ends of each set of bondwires are connected to one of a plurality of conductive bond pads 773 that are exposed at a top surface of IPD assembly 480. To avoid cluttering FIG. 7, only two bondwires in the set of bondwires comprising inductive element 772 are circled and numbered with reference number 772. It should be understood that inductive element 772 includes all bondwires coupled between the output terminal 528 and bond pads 773. Within IPD assembly 480, each bond pad 773 is electrically connected to a first terminal of one or two shunt capacitors 774 on one or both sides of each bond pad 773, and a second terminal of each shunt capacitor 774 is electrically connected (e.g., using through substrate vias) to the ground reference (e.g., to a conductive layer on the bottom surface of IPD assembly 480).

According to an embodiment, each shunt capacitor 774 of harmonic termination circuit 470 may be implemented as a capacitor that is integrally formed with the IPD substrate of IPD assembly 480. For example, each shunt capacitor 774 may be implemented as an integrated MIM capacitor, which includes first and second conductive electrodes (formed from patterned portions of the conductive layers of the build-up structure of IPD assembly 480) that are aligned with each other and electrically separated by dielectric material of the build-up structure. A first electrode (or terminal) of each shunt capacitor 774 is electrically coupled to a single conductive bond pad 773 or to two adjacent conductive bond pads 773, and a second electrode (or terminal) of each shunt capacitor 774 is electrically coupled to the conductive flange (e.g., using through substrate vias), in an embodiment. In a more specific embodiment, the first electrode of each shunt capacitor 774 is "directly connected" (as defined previously) to one or more bond pads 773. In an alternate embodiment, each shunt capacitor 774 may be implemented using a discrete capacitor coupled to a top surface of the IPD assembly 480, or using another type of capacitor.

According to an embodiment, each harmonic termination circuit 470, 471 functions as low impedance path to ground for signal energy at a harmonic frequency (e.g., a second harmonic of a fundamental frequency of operation of device 400). More specifically, the component values for the shunt inductance 572, 772 and the shunt capacitance 574, 774 are selected so that the series combination of the shunt inductance 572, 772 and shunt capacitance 574, 774 resonate at or near the second harmonic frequency. For example, the fundamental frequency of operation of device 400 may be in a range of about 800 megahertz (MHz) to about 6.0 gigahertz (GHz), and thus the second harmonic frequency (and resonant frequency of circuits 470, 471) may be in a range of about 1.6 GHz to about 12.0 GHz. According to an embodiment, inductance 572, 772 may have an inductance value in a range between about 20 pH to about 1 nH, and capacitor(s) 574, 774 may have a capacitance value in a range between about 1 pF to about 100 pF, although these components may have values outside of these ranges, as well. As discussed above in conjunction with FIG. 1, for example, at a fundamental frequency of operation of 2.0 GHz, which has a second harmonic at 4.0 GHz, each of inductances 572, 772 may have an inductance value of about 140 pH, and each of capacitors 574, 774 may have a capacitance value of about 11 pF. However, the designed inductance and/or capacitance values may be affected by mutual coupling between bondwires used to implement inductances 732, 734, and 772.

More specifically, and according to an embodiment, the bondwires corresponding to inductive elements 532, 534, and 572 (or 772, FIG. 7) are physically configured and arranged, with respect to each other, to exhibit a predictable mutual coupling between adjacent sets of bondwires during operation. More specifically, the bondwire profiles (e.g., the heights and shapes of each set of bondwires) and their proximities to other bondwires result in predictable mutual coupling, during operation, that results in different effective inductance values of the inductive elements 532, 534, and 572, during operation, than the self-inductance values of the inductive elements 532, 534, and 572 when each inductance is taken in isolation (i.e., not affected by mutual inductance from other inductances). For example, at a center frequency of operation of 2.0 GHz, the mutual coupling between inductive elements 532 and 534 may be in a range of about 1 pH to about 150 pH (e.g., about 86 pH), the mutual coupling between inductive elements 532 and 572 may be in a range of about 1 pH to about 100 pH (e.g., about 30 pH), and the mutual coupling between inductive elements 534 and 572 may be in a range of about 1 pH to about 150 pH (e.g., about 69 pH).

As discussed previously in conjunction with FIG. 1, the FET (e.g., FET 630) within each transistor die 430, 431 may have a drain-source capacitance (modeled by capacitor 131 in FIG. 1) that is relatively low (e.g., less than about 0.2 pF/W). If such a FET were used in a conventional device, a relatively high D2 inductance between the transistor output and the shunt capacitor within the output impedance matching circuit would be needed to provide adequate output impedance matching. As discussed previously, a relatively high D2 inductance could be achieved using a series combination of a set of bondwires between the transistor die that includes the FET and an additional series inductance, such as an integrated spiral inductor.

According to an embodiment, the D2 inductance provided between the transistor output and the shunt capacitor within the output impedance matching circuit may be significantly reduced, when compared with a conventional device, with the inclusion of an embodiment of a harmonic termination circuit 570, 571. More specifically, during operation of device 500, each harmonic termination circuit 570, 571 is essentially equivalent to a capacitor at a fundamental frequency of operation of the device 500, with the capacitance value being approximately equivalent to the effective capacitance of series-coupled inductor/capacitor 572/574, or series coupled inductor/capacitor 772/774. Because this shunt capacitance is coupled in parallel with the drain-source capacitance between the transistor output and the ground reference, the equivalent shunt capacitance from the combination of inductor/capacitor 572/574, or inductor/capacitor 772/774 effectively increases the drain-source capacitance of the FET within each transistor die 430, 431. In some embodiments, each equivalent shunt capacitance from the combination of inductor/capacitor 572/574 or inductor/capacitor 772/774 has a capacitance value that effectively increases the drain-source capacitance of the FET to which it is connected by at least 10 percent. As a result of this effective increase in the drain-source capacitance, the D2 inductance between the transistor output and the shunt capacitor within the output impedance matching circuit (e.g., capacitor 542 within circuit 450, 451) may be decreased, when compared with conventional circuits. Accordingly, whereas a conventional circuit may require an additional inductor to provide an inductance that is greater than the inductance provided by the bondwires connected between the transistor die and the shunt capacitor within the output impedance matching circuit, no such additional inductance is included in circuits 450, 451. Instead, in circuits 450, 451, bondwires 534 may be directly connected (as defined previously) to shunt capacitance 542.

FIGS. 4-7 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

FIG. 8 is a flowchart of a method for fabricating a packaged RF power amplifier device (e.g., device 400, FIG. 4) that includes embodiments of an output impedance matching circuit, an output video bandwidth circuit, and a harmonic termination circuit (e.g., circuits 200-205, 450, 451, 460, 461, 470, 471, FIGS. 2A-2F, 4), in accordance with various example embodiments. The method may begin, in blocks 802-804, by forming one or more IPD assemblies. More specifically, in block 802, one or more input and output IPDs (e.g., IPD 418, 419, 480, 481, FIGS. 4-7) may be formed. According to an embodiment, each output IPD (e.g., IPDs 480, 481) includes components of an impedance matching circuit, a video bandwidth circuit, and a harmonic termination circuit. For example, each output IPD may include one or more integrated shunt capacitors (e.g., capacitors 542, 566, 574, 774, FIGS. 5-7), one or more envelope inductive elements (e.g., inductive elements 562, FIGS. 5-7), and one or more envelope resistors (e.g., resistors 564, FIGS. 5-7). In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes (e.g., nodes 773, 448, 449, FIGS. 4-7) at a surface of each IPD substrate. As discussed previously, the connection nodes may include conductive bond pads, which may accept attachment of inductive elements (e.g., bondwires 534, 572, 590, 790, FIGS. 5-7). In addition, in block 804, discrete components corresponding to various circuit elements (e.g., bypass capacitors 578, FIGS. 5-7) may be coupled to conductors exposed at the surface of each IPD to form one or more IPD assemblies.

In block 806, for an air cavity embodiment, an isolation structure (e.g., isolation structure 408, FIG. 4) is coupled to a device substrate (e.g., flange 406). In addition, one or more active devices (e.g., transistors 430, 431) and IPD assemblies (e.g., IPD assemblies 418, 419, 480, 481) are coupled to a portion of the top surface of the substrate that is exposed through an opening in the isolation structure. Leads (e.g., input and output leads 402-405, and bias leads 490-493, if included) are coupled to the top surface of the isolation structure. For overmolded (e.g., encapsulated) device embodiments, the isolation structure may be excluded, and the substrate and leads may form portions of a leadframe.

In block 808, the input lead(s), transistor(s), IPD assembly(ies), and output lead(s) are electrically coupled together. For example, the electrical connections may be made using bondwires between the various device components and elements, as discussed previously. Some of the bondwires correspond to inductive components of input or output matching circuits (e.g., bondwires 412, 416, 532, 534, FIGS. 4-7), and harmonic termination circuits (e.g., bondwires 572, 772, FIGS. 4-7), for example. Finally, in block 810, the device is capped (e.g., for an air cavity package) or encapsulated (e.g., with mold compound for an overmolded package). The device may then be incorporated into a larger electrical system (e.g., a Doherty amplifier or other type of electrical system).

An embodiment of an RF amplifier has a first amplification path that includes a transistor die and an impedance matching circuit. The transistor die has a transistor and a transistor output terminal, and the transistor has a drain-source capacitance below 0.2 picofarads per watt. The impedance matching circuit is coupled between the transistor output terminal and an output of the first amplification path. The impedance matching circuit includes a harmonic termination circuit with a first inductive element and a first capacitance connected in series between the transistor output terminal and a ground reference node. An equivalent capacitance from a combination of the first inductive element and the first capacitance in series effectively increases the drain-source capacitance by at least 10 percent. The first inductive element includes a first plurality of bondwires, and the harmonic termination circuit resonates at a harmonic frequency of a fundamental frequency of operation of the RF amplifier. The impedance matching circuit also includes a second inductive element and a second capacitance connected in series between the transistor output terminal and the ground reference node. The second inductive element includes a second plurality of bondwires, and the second plurality of bondwires and the second capacitance are directly connected.

An embodiment of a packaged RF amplifier device includes a device substrate, a first input lead coupled to the device substrate, a first output lead coupled to the device substrate, and a first transistor die coupled to the device substrate. The first transistor die includes a first transistor, a transistor input terminal coupled to the first input lead, and a transistor output terminal coupled to the first output lead. The first transistor has a drain-source capacitance below 0.2 picofarads per watt. The device also includes a first integrated passive device coupled to the device substrate, and an impedance matching circuit coupled between the transistor output terminal and the first output lead. The impedance matching circuit includes a harmonic termination circuit with a first inductive element and a first capacitance connected in series between the transistor output terminal and a ground reference node. An equivalent capacitance from a combination of the first inductive element and the first capacitance in series effectively increases the drain-source capacitance by at least 10 percent. The first inductive element includes a first plurality of bondwires, and the harmonic termination circuit resonates at a harmonic frequency of a fundamental frequency of operation of the RF amplifier. The impedance matching circuit also includes a second inductive element and a second capacitance connected in series between the transistor output terminal and the ground reference node. The second inductive element includes a second plurality of bondwires, and the second plurality of bondwires and the second capacitance are directly connected.

An embodiment of a method of manufacturing an RF amplifier device includes coupling an input lead and an output lead to a device substrate, and coupling a transistor die to the device substrate between the input and output leads. The transistor die includes a transistor and a transistor output terminal, and the transistor has a drain-source capacitance below 0.2 picofarads per watt. The method further includes coupling an integrated passive device to the device substrate between the transistor die and the output lead, where the integrated passive device includes a first capacitance and a second capacitance, the first capacitance includes one or more first capacitors that are integrally formed with the integrated passive device, and the second capacitance also is integrally formed with the integrated passive device. The method further includes creating a harmonic termination circuit by connecting a first inductive element in the form of a first plurality of bondwires between the transistor output terminal and the first capacitance. An equivalent capacitance from a combination of the first inductive element and the first capacitance in series effectively increases the drain-source capacitance by at least 10 percent, and the harmonic termination circuit resonates at a harmonic frequency of a fundamental frequency of operation of the RF amplifier device. The method further includes creating a portion of an impedance matching circuit by connecting a second inductive element in the form of a second plurality of bondwires between the transistor output terminal and the second capacitance. The second plurality of bondwires and the second capacitance are directly connected.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier with a first amplification path that comprises:
   a transistor die with a transistor and a transistor output terminal, wherein the transistor has a drain-source capacitance below 0.2 picofarads per watt; and
   an impedance matching circuit coupled between the transistor output terminal and an output of the first amplification path, wherein the impedance matching circuit includes
      a harmonic termination circuit comprising a first inductive element and a first capacitor connected in series between the transistor output terminal and a ground reference node, wherein an equivalent capacitance from a combination of the first inductive element and the first capacitor in series effectively increases the drain-source capacitance by at least 10 percent, the first inductive element includes a first plurality of bondwires with first ends connected to the output terminal of the transistor die and second ends connected to a first bond pad that is coupled to the first capacitor, and the harmonic termination circuit resonates at a harmonic frequency of a fundamental frequency of operation of the RF amplifier, and
      a second inductive element and a second capacitor connected in series between the transistor output terminal and the ground reference node, wherein the second inductive element includes a second plurality of bondwires with first ends connected to the output terminal of the transistor die and second ends connected to a second bond pad that is coupled to the second capacitor, and wherein the second plurality of bondwires and the second capacitor are directly connected.

2. The RF amplifier of claim 1, wherein the transistor is a gallium nitride transistor.

3. The RF amplifier of claim 1, wherein the first and second capacitors are metal-insulator-metal capacitors.

4. The RF amplifier of claim 1, wherein in the harmonic termination circuit, the first inductive element is directly connected to the first capacitor.

5. The RF amplifier of claim 1, wherein the harmonic termination circuit resonates at a second harmonic frequency of the fundamental frequency of operation.

6. The RF amplifier of claim 1, wherein:
   the first capacitor has a capacitance value in a range of 1 picofarad to 100 picofarads;
   the second capacitor has a capacitance value in a range of 30 picofarads to 500 picofarads;
   the first inductive element has an inductance value in a range of 20 picohenries to 1 nanohenry; and
   the second inductive element has an inductance value in a range of 100 picohenries to 3 nanohenries.

7. The RF amplifier of claim 1, further comprising:
   a video bandwidth circuit coupled to a connection node between the second inductive element and the second capacitor, wherein the video bandwidth circuit includes a plurality of components, wherein the plurality of components includes an envelope resistor, an envelope inductor, and an envelope capacitor coupled in series between the connection node and the ground reference node.

8. The RF amplifier of claim 7, wherein the video bandwidth circuit further includes a bypass capacitor coupled in parallel across one or more of the plurality of components of the video bandwidth circuit.

9. The RF amplifier of claim 8, wherein the bypass capacitor is coupled in parallel across the envelope inductor, and wherein the envelope inductor and the bypass capacitor form a parallel resonant circuit in proximity to a center operating frequency of the RF amplifier.

10. The RF amplifier of claim 1, further comprising:
    a second amplification path;
    a power divider with an input configured to receive an RF signal, a first output coupled to an input of the first amplification path, and a second output coupled to an input of the second amplification path, wherein the power divider is configured to divide the RF signal into a first RF signal that is provided to the first amplification path through the first output, and into a second RF signal that is provided to the second amplification path through the second output; and
    a combining node configured to receive and combine amplified RF signals produced by the first and second amplification paths.

11. The RF amplifier of claim 10, wherein the RF amplifier is a Doherty power amplifier.

12. A packaged radio frequency (RF) amplifier device comprising:
- a device substrate;
- a first input lead coupled to the device substrate;
- a first output lead coupled to the device substrate;
- a first transistor die coupled to the device substrate, wherein the first transistor die includes a first transistor, a transistor input terminal coupled to the first input lead, and a transistor output terminal coupled to the first output lead, and wherein the first transistor has a drain-source capacitance below 0.2 picofarads per watt;
- a first integrated passive device coupled to the device substrate; and
- an impedance matching circuit coupled between the transistor output terminal and the first output lead, wherein the impedance matching circuit includes
  - a harmonic termination circuit comprising a first inductive element and a first capacitor connected in series between the transistor output terminal and a ground reference node, wherein an equivalent capacitance from a combination of the first inductive element and the first capacitor in series effectively increases the drain-source capacitance by at least 10 percent, the first inductive element includes a first plurality of bondwires with first ends connected to the first transistor die and second ends connected to the first integrated passive device, and the harmonic termination circuit resonates at a harmonic frequency of a fundamental frequency of operation of the RF amplifier device, and
  - a second inductive element and a second capacitor connected in series between the transistor output terminal and the ground reference node, wherein the second inductive element includes a second plurality of bondwires with first ends connected to the output terminal of the transistor die and second ends connected to the first integrated passive device, and wherein the second plurality of bondwires and the second capacitor are directly connected.

13. The packaged RF amplifier device of claim 12, wherein the second capacitor is integrally formed with the first integrated passive device.

14. The packaged RF amplifier device of claim 13, wherein the first and second capacitors are metal-insulator-metal capacitors.

15. The packaged RF amplifier device of claim 12, wherein the transistor is a gallium nitride transistor.

16. The packaged RF amplifier device of claim 12, wherein the harmonic termination circuit resonates at a second harmonic frequency of the fundamental frequency of operation.

17. The packaged RF amplifier device of claim 12, wherein:
- the first capacitor has a capacitance value in a range of 1 picofarad to 100 picofarads;
- the second capacitor has a capacitance value in a range of 30 picofarads to 500 picofarads;
- the first inductive element has an inductance value in a range of 20 picohenries to 1 nanohenry; and
- the second inductive element has an inductance value in a range of 100 picohenries to 3 nanohenries.

18. The packaged RF amplifier device of claim 12, further comprising:
- a video bandwidth circuit coupled to a connection node between the second inductive element and the second capacitor, wherein the video bandwidth circuit includes a plurality of components, wherein the plurality of components includes an envelope resistor, an envelope inductor, and an envelope capacitor coupled in series between the connection node and the ground reference node.

19. The packaged RF amplifier device of claim 18, wherein the video bandwidth circuit further includes a bypass capacitor coupled in parallel across one or more of the plurality of components of the video bandwidth circuit.

20. The packaged RF amplifier device of claim 12, further comprising:
- a second input lead coupled to the device substrate;
- a second output lead coupled to the device substrate;
- a second transistor die coupled to the device substrate, wherein the second transistor die includes a second transistor coupled between the second input lead and the second output lead; and
- a second integrated passive device coupled to the device substrate between the second transistor die and the second output.

21. A method of manufacturing a radio frequency (RF) amplifier device, the method comprising the steps of:
- coupling an input lead to a device substrate;
- coupling an output lead to the device substrate;
- coupling a transistor die to the device substrate between the input and output leads, wherein the transistor die includes a transistor and a transistor output terminal, and wherein the transistor has a drain-source capacitance below 0.2 picofarads per watt;
- coupling an integrated passive device to the device substrate between the transistor die and the output lead, wherein the integrated passive device includes a first capacitor and a second capacitor, wherein the first capacitor and the second capacitor are integrally formed with the integrated passive device;
- creating a harmonic termination circuit by connecting a first inductive element in the form of a first plurality of bondwires between the transistor output terminal and the first capacitor, wherein first ends of the first plurality of bondwires are connected to the transistor output terminal, and second ends of the first plurality of bondwires are connected to a first bond pad on the integrated passive device that is coupled to the first capacitor, and wherein an equivalent capacitance from a combination of the first inductive element and the first capacitor in series effectively increases the drain-source capacitance by at least 10 percent, and the harmonic termination circuit resonates at a harmonic frequency of a fundamental frequency of operation of the RF amplifier device; and
- creating a portion of an impedance matching circuit by connecting a second inductive element in the form of a second plurality of bondwires between the transistor output terminal and the second capacitor, wherein first ends of the second plurality of bondwires are connected to the transistor output terminal, and second ends of the second plurality of bondwires are connected to a second bond pad on the integrated passive device that is coupled to the second capacitor, and wherein the second plurality of bondwires and the second capacitor are directly connected.

* * * * *